(12) United States Patent
Ishibashi

(10) Patent No.: US 7,443,897 B2
(45) Date of Patent: Oct. 28, 2008

(54) METHOD FOR DISTINGUISH FAILURE MODES IN AN APC CIRCUIT AND AN OPTICAL TRANSMITTER USING THE SAME

(75) Inventor: Hiroto Ishibashi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/806,848

(22) Filed: Jun. 4, 2007

(65) Prior Publication Data
US 2007/0286610 A1   Dec. 13, 2007

(30) Foreign Application Priority Data
Jun. 5, 2006   (JP)   ............................. 2006-156084

(51) Int. Cl.
*H01S 3/13*   (2006.01)
*H01S 3/00*   (2006.01)
(52) U.S. Cl. .............................. 372/38.09; 372/29.015; 372/38.07
(58) Field of Classification Search .............. 372/29.01, 372/29.015, 38.07, 38.09; 398/197
See application file for complete search history.

(56) References Cited

U.S. PATENT DOCUMENTS 6,952,531 B2   10/2005   Aronson et al.

FOREIGN PATENT DOCUMENTS

JP   2000-022631   1/2000

*Primary Examiner*—Armando Rodriguez
(74) *Attorney, Agent, or Firm*—Smith, Gambrell & Russell, LLP

(57) ABSTRACT

The present invention provides an optical transmitter that enables to distinguish failure modes of the auto-power control (APC) of the laser diode (LD). The transmitter provides the APC circuit comprised of the driver for supplying the driving current, the LD, the PD for monitoring a portion of the output light from the LD, and the control unit for setting the driving current. The control unit monitors, at regular intervals, the bias current to the LD and the time differential of the bias current. The control unit only stops the APC circuit when both the bias current and the time differential of the bias current exceed respective references.

10 Claims, 2 Drawing Sheets

METHOD FOR DISTINGUISH FAILURE MODES IN AN APC CIRCUIT AND AN OPTICAL TRANSMITTER USING THE SAME

BACKGROUND OF THE INVENTION

1. Field of the Invention

The present invention relates to an optical transmitter with an auto-power control (hereafter denoted as APC) circuit able to detect a time differential of a bias current applied to a semiconductor laser diode (LD).

2. Related Prior Art

Conventional optical transmitter generally installs the APC circuit to stabilize an average power and an extinction ratio of an optical output from the transmitter. A photodiode (PD) installed within the optical transmitter detects a portion of the output light from the LD, and a controller that is also installed within the transmitter adjusts bias and modulation currents provided to the LD so as to keep the detected output light constant.

To detect an extraordinary status of the APC circuit, various techniques have been well known such as methods disclosed in Japanese Patent published as JP-2000-022631A or in the U.S. Pat. No. 6,952,531. The former prior art has disclosed the APC circuit that, when the bias current to the LD abnormally increases due to the degradation of the LD, sets an alarm of the bias current and changes the driving mode of the LD to generate an optical power with a predetermined strength. The latter art has disclosed another APC circuit configured to compare signals each input from the transmitter and the receiver with a reference and to turn off the transceiver according to the comparison.

Various factors to cause an abnormally status in the APC circuit are: (1) excess power from the LD due to a failure in the monitoring circuit including the PD, and (2) insufficient power of the LD due to the aging of the LD. These failures are detectable by the controller as an extraordinary in the bias current. For the former case, it is preferable to turn off the LD promptly from the view point of the eye safety or to prevent the optical receiver from being damaged by the excess powered light. On the other hand, for the second case, it is preferable only to set an alarm flag for the upper system but to continue the optical output to maintain the optical communication because, even the output power degrades, the optical communication may be often carried out.

However, the conventional APC circuit sometimes fails to maintain the optical transmission because, when the LD is replaced due to the degradation of the optical output by the aging, a fixed reference can not be adapted to the new LD. This is due to a reason that above two cases are undistinguishable to each other by the conventional system when the alarm is detected at the replacement of the LD. While, the method for shutting down the optical output based on the comparison of the optical output with the reference sometimes causes the failure of the whole communication system because of the complete shutting down of the optical signal.

The present invention has a feature to provide an optical transmitter that enables, in the APC circuit, to control the optical output depending on reasons to set the alarm.

SUMMARY OF THE INVENTION

One aspect of the present invention relates to a configuration of an optical transmitter that includes a semiconductor laser diode, a driver, a photodiode, and a control unit. The laser diode emits an optical signal with a magnitude by being provided with a driving current from the driver. The photodiode monitors a portion of the optical signal. The control unit, by receiving the output of the photodiode and by comparing this output with a preset reference, outputs a condition for the driver so as to keep the output from the photodiode substantially equal to the preset reference. Thus, the laser diode, photodiode, the driver and the control unit configure an auto-power control circuit for the laser diode. In the present optical transmitter according to the invention further provides a function in the control unit that the control unit (a) monitors the driving current directly or indirectly at regular intervals, (b) generates a monitoring signal corresponding to a magnitude of the driving current and a time differential of the monitoring signal, (c) compares the monitoring signal with a first reference and the time differential with a second reference, (d) sets an alarm when the monitoring signal exceeds the first reference, and (e) sets the control signal to the driver so as to stop the supply of the driving current when two failures, one of which is the driving current exceeds the first reference and the other of which is the time differential of the driving current exceeds the second reference, occur.

Another aspect of the present invention relates to a method for controlling the auto-power control circuit that is comprised of the laser diode, the photodiode, the control unit and the driver. A feature of the present method is that the control unit is configured to monitor the driving current at regular intervals, to compare the magnitude of the driving current with the first reference and the time differential of the driving current with the second reference, to set the alarm only when the magnitude of the driving current exceeds the first reference, and to set the control signal provided to the driver by the control unit so as to stop the driving current only when both modes, one of which is that the driving current exceeds the first reference and the other of which is that the time differential of the driving current exceeds the second reference, occur.

According to the present invention, the control unit only sets the alarm when the driving current exceeds the first reference, and sets the control signal to the driver so as to stop the supply of the driving current only when two modes occur, one is that the driving current exceeds the first reference and the other is that the time differential exceeds the second reference. Thus, the present invention may distinguish two types of failures. One is a fatal failure when the feedback loop of the auto-power control breaks down due to, for instance, a breakdown of devices, which accompany with a large time differential of the driving current. While, the other failure, such as an aging of the laser diode, often accompanies with an increase of the driving current but no large time differential of the driving current. The control unit of the present invention only sets the alarm flag for the latter failure, thus, the optical transmitter may continue to emit the optical signal.

DESCRIPTION OF PREFERRED EMBODIMENTS

Next, preferred embodiments of the present invention will be described as referring to accompanying drawings. In the description of drawings, the same numerals or the same symbols will refer to the same elements without overlapping explanations.

Figure 1:
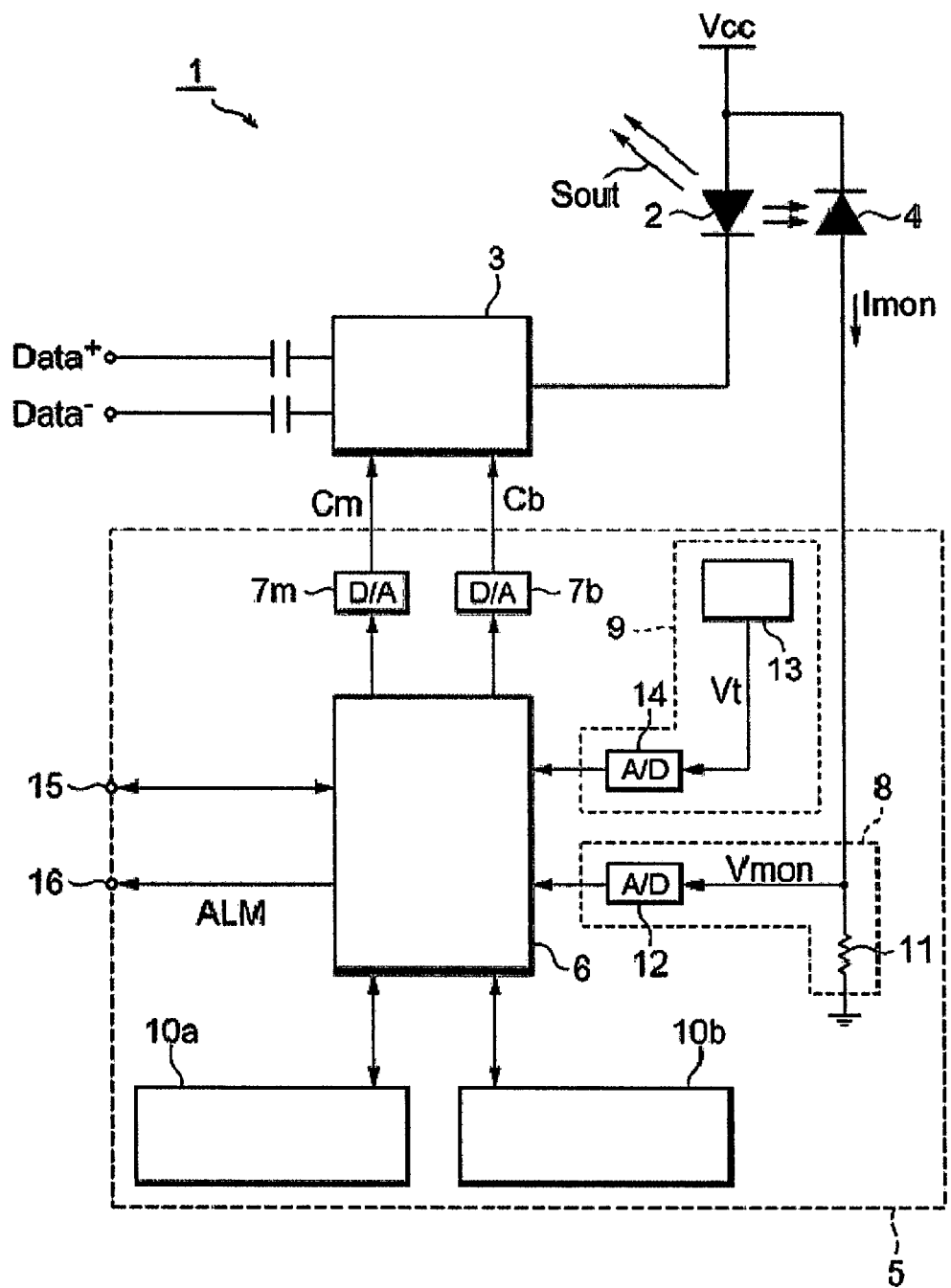
FIG. 1 is a block diagram of an optical transmitter according to the present invention.

FIG. 1 is a block diagram of an optical transmitter 1 according to an embodiment of the present invention. The optical transmitter 1, which is applicable to an optical transceiver used in an optical communication, includes a semiconductor laser diode 2 (hereafter denoted as LD) that emits signal light $S_{OUT}$, a driver 3 for providing a driving current to the LD 2, a photodiode (hereafter denoted as PD) 4 that receives a portion of the signal light $S_{OUT}$ emitted from the LD 2, and a control unit 5 to control the driving current.

The anode of the LD 2 receives the bias supply $V_{cc}$, while the cathode thereof is connected with output terminals of the driver 3. The driver 3, depending on control signals, Cm and Cb, provides the modulation current $I_M$ and the bias current $I_B$ to the LD 2. The driver 3 modulates the modulation current $I_M$ by the input signals, Data+ and Data− complementary to each other, which are provided from the outside of the optical transmitter The power supply $V_{cc}$ is provided to the anode of the LD 2 and the cathode of the PD 4. The PD 4, by receiving a portion of the signal light $S_{OUT}$, generates a photocurrent $I_{MON}$ corresponding to the magnitude of the light $S_{OUT}$.

The control unit 5 includes a logic unit 6, two digital-to-analog converters (hereafter denoted as D/A-C), 7m and 7b, a monitoring unit 8 for monitoring the magnitude of the photocurrent $I_{MON}$, a sensing unit 9 to monitor a temperature of the optical transmitter 1, and two memories, 10a and 10b, each connected to the logic unit 6.

The monitoring unit 8 includes a resistor 10 and an analog-to-digital converter 12 (hereafter denoted as A/D-C). The resistor 11, connected to the anode of the PD 4, converts the photocurrent $I_{MON}$ into a corresponding voltage signal $V_{MON}$. The A/D-C 12, connected to a node between the PD 4 and the resistor 11, converts the voltage signal $V_{MON}$ to a digital signal.

The sensing unit 9 includes a sensor 13, such as thermistor, installed within the transmitter 1 and a second A/D-C 14 interposed between the sensor and the logic unit 6 to convert an analog signal $V_T$ that corresponds to the temperature of the optical transmitter 1 into a digital signal to guide it to the logic unit 6.

The logic unit 6, which is an arithmetic unit including a central processing unit (CPU) or a digital signal processor, is configured to receive a digital signal that corresponds to the signal $V_{MON}$, to compare this digital signal with a reference, and to output control signals with a digital form to respective D/C-Cs, 7m and 7b, based on this comparison. The D/A-Cs, 7m and 7b, convert these digital signals into analog forms, Cb and Cm, and provide them to the driver 3. The logic unit 6 may further provide a port 15 for communicating with an external host system and another port 16 to send an alarm signal to the external host system. These communication ports, 15 and 16, may be integrated to single port with a serial communication configuration. Thus, the driver 3, the LD 2, the PD 4, and the logic unit may constitute an auto-power control (APC) circuit for the LD 2.

The operation of the logic unit will be specifically described. The logic unit 6 sets two digital signals to the D/A-Cs, 7b and 7m, by an algorithm of the proportional control (P control), the integration control (I control), or the differential control (D control), or a combination of these controls such as the PID control and the PI control such that the input signal corresponding to the monitored signal $V_{MON}$ becomes the reference. Thus, the logic unit performs the APC control for the LD 2. Then, the logic unit 6 sets the digital signal for the modulation current $I_M$ by one of the following two methods: (1) the logic unit 6 fixes the value for the modulation current IM or adjusts the value only for compensating the temperature dependence of the LD 2; (2) the logic unit 6 sets the value for the modulation current IM as a function of the monitored signal or as a function of the monitored signal with the sensed temperature; or (3) the logic unit 6 sets the value for the modulation current by measuring or estimating an amplitude of the driving signal, Data+ or Data−, or a slope efficiency of the LD 2.

Moreover, the logic unit 6 of the present embodiment provides a function to detect an extraordinary mode of the APC operation. That is, the logic unit 6 monitors the bias current $I_B$ for the LD 2 at regular intervals Δt, and evaluates a time differential of the bias current. The logic unit 6, when the magnitude of the bias current or the time differential thereof shows an extraordinary state, outputs an alarm signal ALM to the port 16 and stops the supply of the driving current including the bias current and the modulation current to the LD 2.

Specifically, the logic unit 6 monitors the bias current, or the control signal in a digital form to set the bias current $I_B$, at a regular interval Δt. Assuming the control signal for the bias current at a time t and at a time t−Δt are, $I_B(t)$ and $I_B(t−Δt)$, respectively, the control unit 6 may calculate the time differential $ΔI_B/Δt$ of the control signal by:

$$ΔI_B/Δt = \{I_B(t) - I_B(t-Δt)\}/Δt.$$

Then, the logic unit 6 reads a first reference, which depends on the temperature of the optical transmitter 1, from a memory 10b to compare thus calculated time differential $ΔI_B/Δt$ with the first reference.

The memory 1 may store a set of first references each corresponding to a temperature of the optical transmitter 1, that is, the memory 10b holds the first references, $I_{BTh}(T_0)$, $I_{BTh}(T_1)$, ..., $I_{BTh}(T_n)$, for temperatures $T_0, T_1, ..., T_n$, respectively. First, the logic unit 6 monitors a current bias current $I_B(t)$ and concurrently receives a signal corresponding to the present temperature $T_i$ of the LD 2 from the sensing unit 9. Second, the logic unit 6 reads out from the memory 10b one of the references $I_{BTh}(T_i)$ that corresponds to the temperature $T_i$, and compares the read data $I_{BTh}(T_i)$ with the present bias current $I_B(t)$. When the read value $I_B(t)$ exceeds the reference $I_{BTh}(T_i)$, the logic unit further compares the time differential of the bias current $ΔI_B/Δt$ with a second reference $ΔI_{BTh}$. When the monitored differential $ΔI_B/Δt$ exceeds the second reference $ΔI_{BTh}$, the logic unit 6 finally decides that the monitoring unit 8 breaks down and sets the control signal to the driver 3 so as to stop the optical output $S_{OUT}$ from the LD 2. While, the logic unit 6 only sets the alarm ALM by deciding that the failure is due to the aging of the LD 2 when only the bias current IB exceeds the first reference $I_{BTh}(T_i)$.

The description above assumes that the second reference $ΔI_{BTh}$ is constant, but the memory 10b may also store a set of second references each corresponding to the temperatures $T_i$, similar to the first references. The second reference $ΔI_{BTh}$ may be multiplied by the time interval Δt, which may omit the divisional calculation at the evaluation of the time differential $ΔI_B/Δt$ of the bias current.

The interval Δt to evaluate the time differential is preferable to be shorter than 100 msec from a view point of the eye safety, which brings to an advantage that, during such relatively shorter interval, the temperature of the optical transmitter 1 may be unchanged and is unnecessary to consider the temperature dependence for the second reference. When the logic unit 6 is forced to set the interval Δt relatively longer, sometimes longer than 1 minute, due to the performance of the logic unit 6 themselves, or occasionally it is unnecessary to consider the eye safety, the logic unit 6 may determine the time differential $\Delta I_B/\Delta t$ by reading out data stored in another memory 10a.

That is, the memory stores a set of initial conditions for the bias current, $I_{INIT}(T_0)$, $I_{INIT}(T_1)$, ..., $I_{INIT}(T_n)$, each corresponding to the temperatures, $T_0, T_1, \ldots, T_n$. These initial conditions for the bias current $I_B$ may be measured at the production of the optical transmitter 1 when the characteristics of the LD 2 including the temperature dependence of various parameters thereof are measured as varying the temperatures. The logic unit 6, assuming the bias current and the temperature at a time t are $I_B(t)$ and Temp (t), respectively, may read out the initial condition $I_{BINIT}(\text{Temp}(t))$ from the memory 10a. The logic unit 6, assuming the bias current and the temperature at a time t−Δt are $I_B(t-\Delta t)$ and Temp (t−Δt), respectively, may also read out the initial conduction $I_{BINT}$ (Temp (t−Δt)) from the memory 10a. The logic unit 6 may calculate by the following equation the estimated bias current $I_{BVir}(t-\Delta t)$ when the temperature at the time t−Δt is Temp(t);

$$I_{BVir}(t-\Delta t)=I_B(t-\Delta t)\times I_{BINIT}(t)/I_{BINT}(\text{Temp }(t-\Delta t))$$

Thus, the logic unit 6 may calculate the time differential $\Delta I_B/\Delta t$ with omitting the influence of the change in the temperature.

According to thus described optical transmitter 1, the driving currents, $I_M$ and $I_B$, are controlled by monitoring the photocurrent $I_{MON}$ in the APC circuit including the LD 2, the PD 4, the control unit 5 and the driver 3. Concurrently, the logic unit 6 within the control unit 5 compares the bias current $I_M(t)$ at a time t with the reference $I_{BTh}$ and, in addition to this comparison, the logic unit 6 compares at a time differential of the bias current $\Delta I_B/\Delta t$ with the second reference $\Delta I_{BTh}$. Then, depending on these comparisons, the control unit 5 sends the alarm ALM to the host system and/or stops the supply of the driving current, $I_B$ and $I_M$, to the LD 2. Thus, the transmitter 1 enables to distinguish two modes of the failure, due to the substantial breakdown of the APC circuit or due to the aging of the LD, and to shut down the transmitter only when the former mode of the failure occurs.

Figure 2:
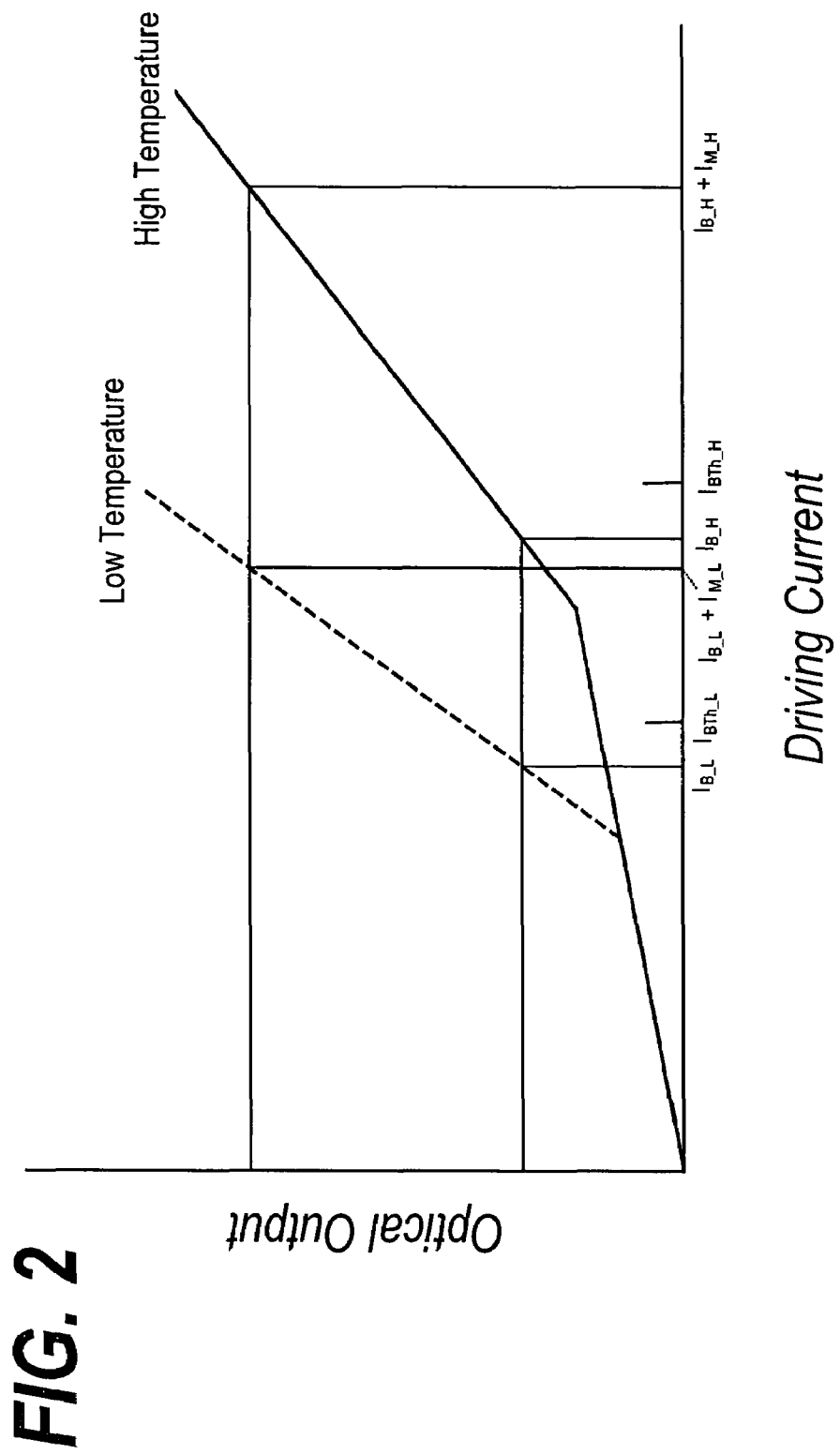
FIG. 2 shows a relation between the driving current provided to the laser diode and the optical output power at different temperatures.

The references $I_{BTh}$ to be compared with the bias current $I_B$ are variable depending on the temperature of the optical transmitter 1, which takes the temperature dependence of the I-L characteristic of the LD shown in FIG. 2 into account. The logic unit 6 sets, depending on the sensing signal from the sensor unit 13, the greater reference $I_{BTh}$ at a high temperature compared to those at low temperatures. Thus, the optical transmitter 1 enables to detect the abnormality taking the temperature dependence of the optical output power of the LD 2 into account.

In the above description, the logic unit 6 monitors the bias current $I_B$ thorough the control parameter given to the D/A-C 7b. However, the logic unit may detect the bias current directly by providing the current detecting unit connected to the LD 2 or set within the driver 3. In this case, the logic unit 6 may obtain a parameter $I_B'$ for the bias current $I_B$ by an equation of: $I_B'=\alpha\times I_B^{(M)}+\beta\times I_B^{(S)}$, where $I_B^{(M)}$ and $I_B^{(S)}$ are a value directly measured with the current detector and a value to be set for the D/A-C 7b, respectively, and α and β are weighting parameters given by α+β=1. According to this calculation, the averaging time for the sampling of the bias current may be determined with a combination of α and the time interval Δt of the sampling.

In a modification, the logic unit 6 may detect the modulation current $I_M$ and the time differential thereof in addition to or instead of the bias current $I_B$. Further, in a case that the APC circuit controls the maximum $I_B+I_M$ and the minimum $I_B$ of the driving current, or controls the average $(I_B+I_M)/2$ and the amplitude of the modulation signal given to the LD 2, the logic unit 6 may compare such various parameters and time differentials thereof with respective references.

Moreover, the memory, 10a or 10b, stores the references or the initial conditions as discrete parameters in connection with the temperatures. In a case that the practical temperature T of the LD is between $T_i$ and $T_j$, where i and j are indexes, the logic unit 6 may read out the reference $I_{BTh}(T_i)$ or $I_{Bth}(T_j)$, or may calculate the reference $I_{BTh}(T)$ by the interpolation or the extrapolation using the values $I_{BTh}(T_i)$, $I_{Bth}(T_j)$ and others stored in the memory.

In the present optical transmitter 1, the memory 10b may store two types of references for the same temperature. That is, the logic unit 6 first compares the parameter for the bias current $I_B$ with the first type of the reference $I_{BTh\_H}(T)$, and, after setting the alarm when the parameter exceeds the reference, the logic unit 6 compares the parameter with the second type of the reference $I_{BTh\_L}(T)$ to decide whether the APC circuit recovers a normal state. Thus, the logic unit 6 may suppress the chattering when the parameter for the bias current $I_B$ becomes close to the reference.

The embodiment above described senses the temperature of the optical transmitter 1. However, the sensor 13 within the sensing unit 9 may detect a temperature of the LD 2, and the memory 10b may store the first reference in connection with the temperatures of the LD 2.

What is claimed is:

1. An optical transmitter, comprising:
   a semiconductor laser diode that emits an optical signal;
   a driver that provides a driving current for the laser diode;
   a photodiode configured to sense a portion of the optical signal emitted from the laser diode and to generate a sensing signal corresponding to the portion of the optical signal; and
   a control unit configured to provide a control signal to the driver based on the sensing signal to keep the sensing signal constant,
   wherein the control unit is configured to monitor the driving current at regular intervals to generate a monitoring signal corresponding to a magnitude of the driving current and a time differential of the monitoring signal, to compare the monitoring signal with a first reference and the time differential of the monitoring signal with a second reference, to set an alarm when the monitoring signal exceeds the first reference, and to set the control signal so as to stop a supply of the driving current to the laser diode when the monitoring signal exceeds the first reference and the time differential of the monitoring signal exceeds the second reference.

2. The optical transmitter according to claim 1,
   wherein the control unit includes a temperature sensor, the first reference being changed depending on the temperature.

3. The optical transmitter according to claim 1,
   wherein the control unit generates the monitoring signal through a monitoring of the control signal at regular intervals.

4. The optical transmitter according to claim 1,
   further comprising a current monitor for directly monitoring the driving current,
   wherein the control unit generates the monitoring signal by averaging the control signal to be provided to the driver and an output of the current monitor of the driving current.

5. A method for controlling an auto-power control for a semiconductor laser diode installed in an optical transmitter, the auto-power control being configured by the laser diode, a photodiode for monitoring an optical output from the laser diode, a driver for providing a driving current to the laser diode, and a control unit configured to compare the optical output with a reference and to generate a control signal so as to become the optical output substantially equal to the reference, the driver setting the driving current based on the control signal output from the control unit, the method comprising steps of:

(a) monitoring the driving current at regular intervals;
(b) comparing a magnitude of the driving current with a first reference, and a time differential of the driving current with a second reference;
(c) setting an alarm when the magnitude of the driving current exceeds a first reference; and
(d) setting the control signal by the control unit so as to stop the driving current when the magnitude of the driving current exceeds the first reference and the time differential of the driving current exceeds a second reference.

6. The method according to claim 5,
wherein the controller includes a memory for storing a set of first references in connection with temperatures and a sensing unit including a temperature sensor,
wherein the step (b) includes steps of,
(b-1) reading the temperature of the optical transmitter by the temperature sensor,
(b-2) reading one of the first references corresponding to the temperature,
(b-3) comparing the magnitude of the driving current with the one of the first references, and
(b-4) comparing the time differential of the driving current with the second reference.

7. The method according to claim 6,
wherein the step (b-2) includes steps of,
reading a plurality of first references in connection with the temperature sensed by the temperature sensor at the step (b-1), and
calculating a value corresponding to the first reference to be compared with the magnitude of the driving current by the interpolation or the extrapolation of the first references read from the memory.

8. The method according to claim 6,
wherein the step (a) includes,
reading the control signal provided to the driver,
reading the driving current supplied to the laser diode, and
averaging the read control signal and the read driving current to obtain a value to be compared with the first reference.

9. The method according to claim 5,
wherein the control unit includes a memory to store conditions for the driving current in connection with the temperature,
wherein the step (b) includes,
(b-1) reading a first condition from the memory in connection with the present temperature,
(b-2) reading a second condition from the memory in connection with a temperature under which a previous driving current is monitored,
(b-3) correcting the previously monitored driving current by multiplying a ratio of the first condition to the second condition, and
(b-4) calculating the time differential of the driving current by a difference between the presently monitored driving current and the corrected driving current.

10. The method according to claim 5,
wherein the controller includes a memory for storing a set of first references in connection with temperatures and a sensing unit including a temperature sensor,
wherein the step (b) includes steps of,
(b-1) sensing the temperature of the LD by the temperature sensor,
(b-2) reading the first references corresponding to the temperature sensed by the temperature sensor at the step (b-1),
(b-3) comparing the magnitude of the driving current with the one of the first references, and
(b-4) comparing the time differential of the driving current with the second reference.

* * * * *